United States Patent
Yeh et al.

(10) Patent No.: US 10,373,954 B2
(45) Date of Patent: Aug. 6, 2019

(54) FINFET AND MANUFACTURING METHOD OF THE SAME

(71) Applicant: Realtek Semiconductor Corporation, Hsinchu (TW)

(72) Inventors: Ta-Hsun Yeh, Hsinchu (TW); Cheng-Wei Luo, Hsinchu (TW); Hsiao-Tsung Yen, Hsinchu (TW); Yuh-Sheng Jean, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/167,554

(22) Filed: Oct. 23, 2018

(65) Prior Publication Data
US 2019/0057965 A1  Feb. 21, 2019

Related U.S. Application Data (62) Division of application No. 15/299,479, filed on Oct. 21, 2016, now abandoned.

(30) Foreign Application Priority Data

Jun. 28, 2016 (TW) .............................. 105120341 A (51) Int. Cl.
*H01L 27/08* (2006.01)
*H01L 27/088* (2006.01)
(Continued)

(52) U.S. Cl.
CPC .... *H01L 27/0886* (2013.01); *H01L 21/30604* (2013.01); *H01L 21/823431* (2013.01);
(Continued)

(58) Field of Classification Search
CPC .......... H91L 27/0886; H01L 21/30604; H01L 21/823431; H01L 29/0661; H01L 29/0847;
(Continued)

(56) References Cited

U.S. PATENT DOCUMENTS 8,174,071 B2    5/2012  Tien et al.
8,524,547 B2 *  9/2013  Nowak ................. H01L 29/785
                                                257/E29.022
(Continued)

FOREIGN PATENT DOCUMENTS

TW          201608716 A      3/2016

*Primary Examiner* — William Coleman
(74) *Attorney, Agent, or Firm* — CKC & Partners Co., LLC (57) ABSTRACT

A FinFET that includes a semiconductor substrate that has insulating areas, a fin structure, a gate dielectric layer, a gate electrode structure, a drain structure and a source structure is provided. The fin structure is disposed to extend on the semiconductor substrate between two insulating areas. The gate dielectric layer is disposed to extend across two sides of the fin structure. The gate electrode structure is disposed on the gate dielectric layer. The drain structure is disposed at a first side of the gate electrode structure and has a first resistance relative to the gate electrode. The source structure is disposed at a second side of the gate electrode structure and has a second resistance relative to the gate electrode. The first resistance is larger than the second resistance.

3 Claims, 8 Drawing Sheets

(51) Int. Cl.
*H01L 21/306* (2006.01)
*H01L 21/8234* (2006.01)
*H01L 29/08* (2006.01)
*H01L 29/78* (2006.01)
*H01L 29/66* (2006.01)
*H01L 29/06* (2006.01)

(52) U.S. Cl.
CPC ...... *H01L 29/0661* (2013.01); *H01L 29/0847* (2013.01); *H01L 29/66795* (2013.01); *H01L 29/7851* (2013.01)

(58) Field of Classification Search
CPC ........... H01L 29/66795; H01L 29/7851; H01L 27/0886
See application file for complete search history.

(56) References Cited

U.S. PATENT DOCUMENTS

| | | |
|---|---|---|
| 9,620,602 B2 | 4/2017 | Watanabe et al. |
| 2013/0148409 A1* | 6/2013 | Chung .................. G11C 17/18 |
| | | 365/148 |
| 2014/0092506 A1 | 4/2014 | Ahsan et al. |
| 2016/0056154 A1 | 2/2016 | Watanabe et al. |
| 2016/0056232 A1 | 2/2016 | Kuo et al. |
| 2017/0323942 A1* | 11/2017 | Voldman ............. H01L 29/1083 |

\* cited by examiner

301 — Provide transistor precursor including semiconductor substrate, fin structures, gate dielectric layer and gate electrode structure 302 — Perform etch at first positions and second positions of fin structure, wherein first positions are at first side of fin structures relative to gate electrode structure and has a first distance therefrom, second positions are at second side of fin structures relative to gate electrode structure and has second distance therefrom, first distance is larger than second distance 303 — Form drain structures at first positions and form source structures at second positions

FINFET AND MANUFACTURING METHOD OF THE SAME

RELATED APPLICATIONS

This application a division of U.S. application Ser. No. 15/299,479, filed Oct. 21, 2016, which claims priority to Taiwan Application Serial Number 105120341, filed Jun. 28, 2016, which is herein incorporated by reference.

BACKGROUND

Field of Disclosure

The present disclosure relates to a semiconductor technology. More particularly, the present disclosure relates to a FinFET and a manufacturing method of the same.

Description of Related Art

Due to the shrinking size of semiconductor circuits and the higher demand of the driving ability, transistors are required to generate large driving currents under the condition that the size of the transistors becomes smaller. Leakage current is easily generated when the gate length of the conventional transistors becomes smaller than 20 nano meters. Further, the influence of the gate on the channel decreases when the gate length shrinks. Under such a condition, FinFETs that have three-dimensional source structures and drain structures successfully address the above issues and become the mainstream semiconductor technology in recent years.

However, since the size is small, the semiconductor channel of the FinFETs is not able to endure a high voltage. The FinFETs are thus not easily to be used in high voltage environments. Accordingly, what is needed is a FinFET and a manufacturing method of the same to address the above issues.

SUMMARY

An aspect of the present invention is to provide a fin field effect transistor (FinFET) that comprises a semiconductor substrate, a fin structure, a gate dielectric layer, a gate electrode structure, a drain structure and a source structure. The semiconductor substrate includes a plurality of insulating areas. The fin structure is disposed to extend on the semiconductor substrate between two of the insulating areas. The gate dielectric layer is disposed to extend across two sides of the fin structure. The gate electrode structure is disposed on the gate dielectric layer. The drain structure is disposed at a first side of the fin structure relative to the gate electrode structure and has a first resistance relative to the gate electrode. The source structure is disposed at a second side of the fin structure relative to the gate electrode structure and has a second resistance relative to the gate electrode, wherein the first resistance is larger than the second resistance.

Another aspect of the present invention is to provide a FinFET manufacturing method that includes the steps outlined below. A transistor precursor that includes a semiconductor substrate, a fin structure, a gate dielectric layer and a gate electrode structure is provided. The semiconductor substrate includes a plurality of insulating areas. The fin structure is disposed to extend on the semiconductor substrate between two of the insulating areas. The gate dielectric layer is disposed to extend across two sides of the fin structure. The gate electrode structure is disposed on the gate dielectric layer. Etching is performed on a first position and a second position of the fin structure, wherein the first position is at a first side of the fin structure relative to the gate electrode structure and the second position is at a second side of the fin structure relative to the gate electrode structure. A drain structure at the first position is formed and a source structure is formed at the second position, wherein the drain structure has a first resistance relative to the gate electrode and the source structure has a second resistance relative to the gate electrode, and the first resistance is larger than the second resistance.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In order to make the objects, technical solutions and advantages of the present disclosure apparent, diagrams in combination of examples are used to describe the present disclosure in further detail. It should be understood that the specific embodiments described herein are merely examples for explaining the present disclosure and are not intended to limit the present disclosure.

Figure 1A:
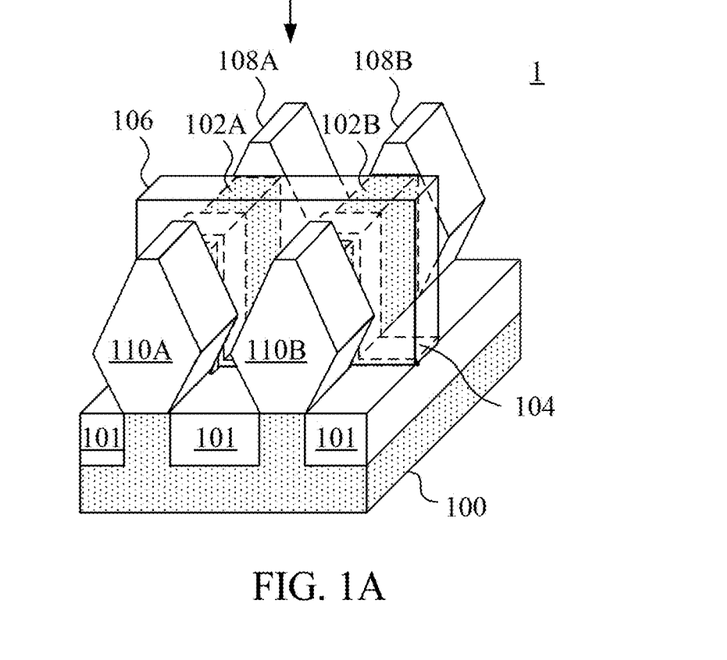
FIG. 1A is a three-dimensional (3-D) diagram of a FinFET in an embodiment of the present invention.
Figure 1B:
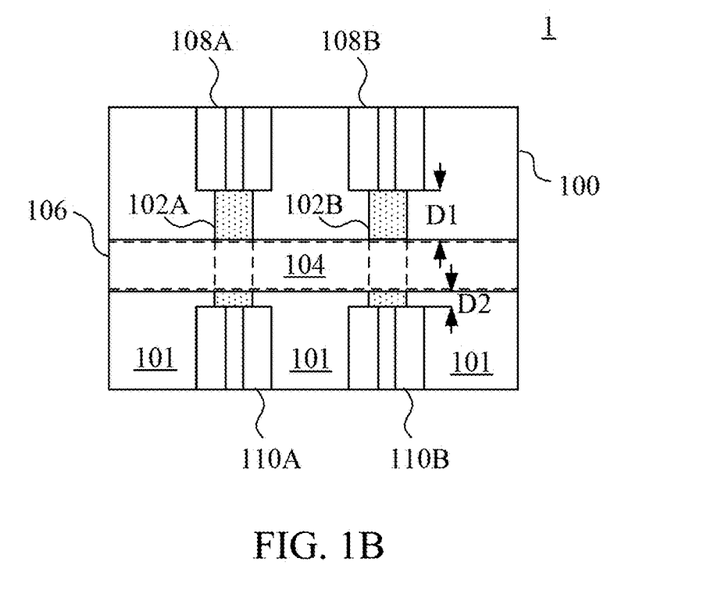
FIG. 1B is a top view of the FinFET along the direction A in FIG. 1A in an embodiment of the present invention.

Reference is now made to FIG. 1A and FIG. 1B at the same time. FIG. 1A is a three-dimensional (3-D) diagram of a fin field effect transistor (FinFET) 1 in an embodiment of the present invention. FIG. 1B is a top view of the FinFET 1 along the direction A in FIG. 1A in an embodiment of the present invention.

The FinFET 1 includes a semiconductor substrate 100, fin structures 102A and 102B, a gate dielectric layer 104, a gate electrode structure 106, drain structures 108A and 108B and source structures 110A and 110B. It is appreciated that since the gate dielectric layer 104 is covered by the gate electrode structure 106, the gate dielectric layer 104 is illustrated by using dashed lines in FIG. 1A and FIG. 1B.

In an embodiment, the semiconductor substrate 100 is such as, but not limited to a silicon substrate. The semiconductor substrate 100 includes a plurality of insulating areas 101. The insulating areas 101 include such as, but not limited to shallow trench isolation structures. The insulating areas 101 includes insulating material such as, but not limited to silicon oxide. In an embodiment, the silicon oxide is $SiO_2$.

Each of the fin structures 102A and 102B is disposed to extend on the semiconductor substrate 100 between two of the insulating areas 101. In an embodiment, the original semiconductor substrate 100 has a height the same as the height of the fin structures 102A and 102B. After removing parts of the semiconductor substrate 100 corresponding to the insulating areas 101, insulating material is deposited such that the part of the semiconductor substrate 100 between the two insulating areas 101 serves as the fin structures 102A and 102B. In another embodiment, the fin structures 102A and 102B can also be epitaxially grown from the surface of the semiconductor substrate 100.

The gate dielectric layer 104 is disposed to extend across two sides of the fin structures 102A and 102B. In an embodiment, the direction of the gate dielectric layer 104 is disposed to be substantially orthogonal to the fin structures 102A and 102B. It is appreciated that the term "substantially orthogonal" means that the angle between the gate dielectric layer 104 and the fin structures 102A and 102B is not necessarily 90 degrees and can have a reasonable offset from 90 degrees. The gate dielectric layer 104 can include such as, but not limited to high K material.

The gate electrode structure 106 is disposed on the gate dielectric layer 104. In an embodiment, the gate electrode structure 106 includes such as, but not limited to metal material. In operation of the FinFET 1, by applying voltage on the gate electrode structure 106, a semiconductor channel is formed at the positions of the fin structures 102A and 102B corresponding to the gate electrode structure 106 and the gate dielectric layer 104 to allow the electrical current flowing through.

Each of the drain structures 108A and 108B is disposed at a first side of the fin structures 102A and 102B relative of the gate electrode structure 106. Each of the source structures 110A and 110B is disposed at a second side of the fin structures 102A and 102B relative to the gate electrode structure 106.

In an embodiment, the drain structures 108A and 108B and the source structures 110A and 110B are formed by such as, but not limited to epitaxial growth. In an embodiment, the material of the drain structures 108A and 108B and the source structures 110A and 110B includes such as, but not limited to SiGe.

In an embodiment, the drain structures 108A and 108B are electrically coupled to each other. The source structures 110A and 110B are electrically coupled to each other. The resistance of each of the drain structures 108A and 108B relative to the gate electrode 106 is larger than the resistance of each of the source structures 110A and 110B relative to the gate electrode 106.

In the present embodiment, the drain structures 108A and 108B and the gate electrode structure 106 have a first distance D1 therebetween. The source structures 110A and 110B and the gate electrode structure 106 have a second distance D2 therebetween, wherein the first distance D1 is larger than the second distance D2. Accordingly, by using the disposition of different distances, the resistance of each of the drain structures 108A and 108B relative to the gate electrode 106 is larger than the resistance of each of the source structures 110A and 110B relative to the gate electrode 106.

In operation, the drain structures 108A and 108B can be either directly electrically coupled to a first voltage source (not illustrated) or electrically coupled to the first voltage source through other electric components. The source structures 110A and 110B can be either directly electrically coupled to a second voltage source (not illustrated) or electrically coupled to the second voltage source through other electric components. The voltage level of the first voltage source is higher than that of the second voltage source. As a result, when the voltage is applied to the gate electrode structure 106, the electric current flows from the drain structures 108A and 108B through the semiconductor channel to the source structures 110A and 110B.

Since in the FinFET 1 of the present invention, the first distance D1 between the drain structures 108A and 108B and the gate electrode structure 106 is larger than the second distance D2, the FinFET 1 has a larger resistance between the drain structures 108A and 108B and the gate electrode structure 106.

As a result, when the FinFET 1 is operated under a high voltage condition, i.e. the first voltage source that the drain structures 108A and 108B is electrically coupled to has a higher voltage, a larger voltage can be endured across the region between the drain structures 108A and 108B and the gate electrode structure 106. The high voltage across the semiconductor channel corresponding to the gate electrode structure 106 and the gate dielectric layer 104 can be avoided.

It is appreciated that the embodiment that has two fin structures 102A and 102B and the corresponding two drain structures 108A and 108B and two source structures 110A and 110B is merely an example. In other embodiments, the FinFET 1 has one or more fin structures and correspondingly has one or more drain structures and one or more source structures.

Figure 2A:
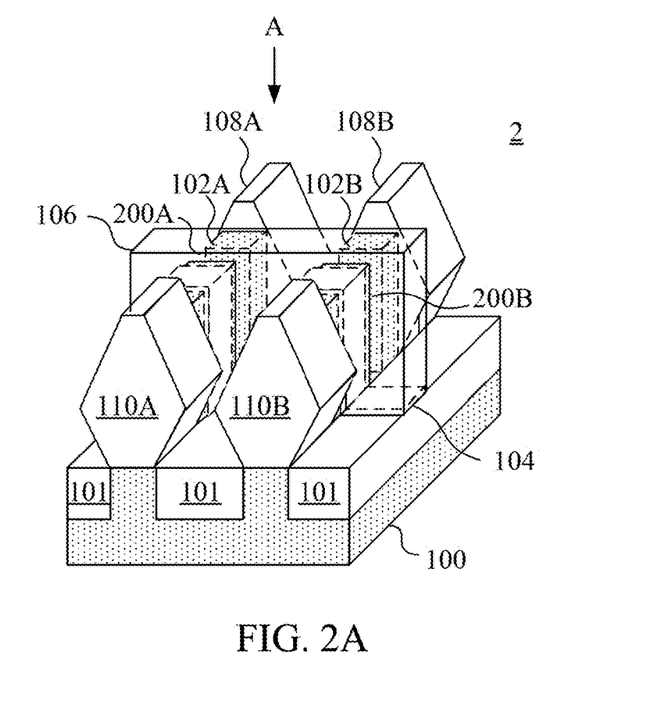
FIG. 2A is a three-dimensional (3-D) diagram of a FinFET in an embodiment of the present invention.
Figure 2B:
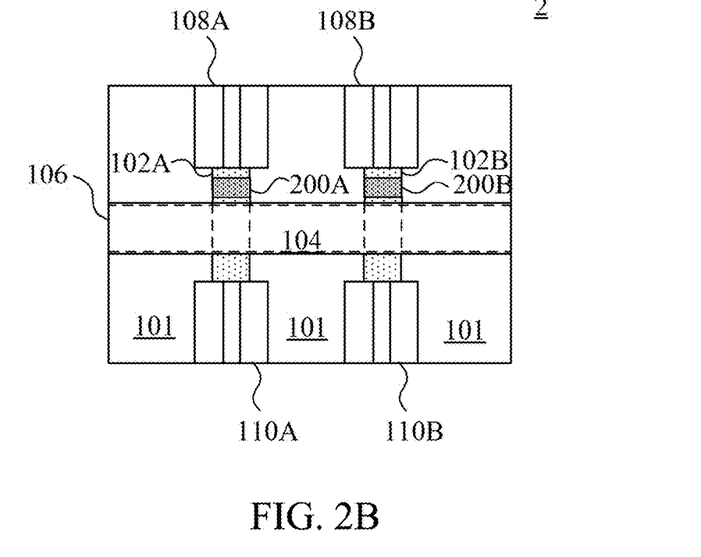
FIG. 2B is a top view of the FinFET along the direction A in FIG. 2A in an embodiment of the present invention.

Reference is now made to FIG. 2A and FIG. 2B at the same time. FIG. 2A is a three-dimensional (3-D) diagram of a FinFET 2 in an embodiment of the present invention. FIG. 2B is a top view of the FinFET 2 along the direction A in FIG. 2A in an embodiment of the present invention.

Similar to the FinFET 1 illustrated in FIG. 1A and FIG. 1B, the FinFET 2 includes the semiconductor substrate 100, the fin structures 102A and 102B, the gate dielectric layer 104, the gate electrode structures 106, the drain structures 108A and 108B and the source structures 110A and 110B. The semiconductor substrate 100, the gate dielectric layer 104 and the gate electrode structures 106 are identical to those in the FinFET 1. As a result, the details of these components are not described herein.

In the present embodiment, the distance of the drain structures 108A and 108B relative to the gate electrode structure 106 and distance of the source structures 110A and 110B relative to the gate electrode structure 106 are the same. However, the fin structures 102A and 102B further include trenches 200A and 200B between the gate electrode structure 106 and the drain structures 108A and 108B.

When the voltage is applied to the gate electrode structure 106 such that the FinFET 2 is conducted, the current that flows from the drain structures 108A and 108B to the channel has to pass through the parts under the trenches 200A and 200B. Since the area that the current flows through is smaller, the FinFET 2 has a larger resistance between the drain structures 108A and 108 and the gate electrode structure 106. The FinFET 2 in the present embodiment can endure a higher voltage across the drain structures 108A and 108B and the gate electrode structure 106. As a result, FinFET 2 in the present embodiment can be operated under a high voltage condition.

Figure 2C:
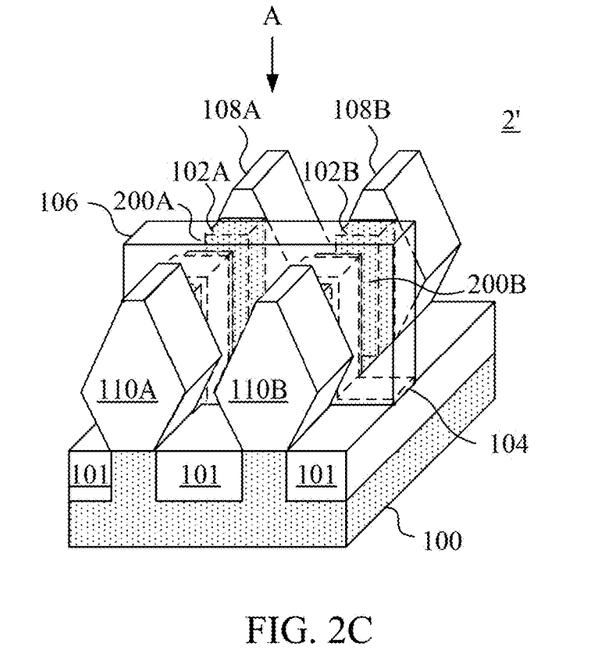
FIG. 2C is a three-dimensional (3-D) diagram of a FinFET in an embodiment of the present invention.
Figure 2D:
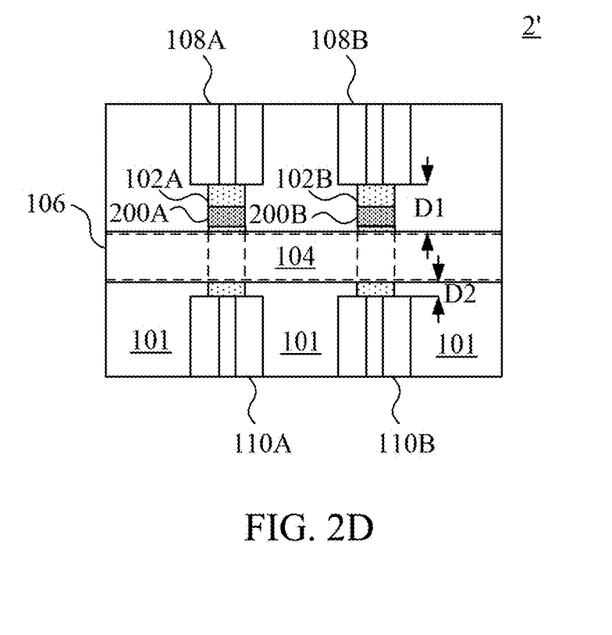
FIG. 2D is a top view of the FinFET along the direction A in FIG. 2C in an embodiment of the present invention.

Reference is now made to FIG. 2C and FIG. 2D at the same time. FIG. 2C is a three-dimensional (3-D) diagram of a FinFET 2' in an embodiment of the present invention. FIG. 2D is a top view of the FinFET 2' along the direction A in FIG. 2C in an embodiment of the present invention.

Similar to the FinFET 2 illustrated in FIG. 2A, the FinFET 2' includes the semiconductor substrate 100, the fin structures 102A and 102B, the gate dielectric layer 104, the gate electrode structures 106, the drain structures 108A and 108B and the source structures 110A and 110B. Further, the fin structures 102A and 102B of the FinFET 2' also have the trenches 200A and 200B. However, in the present embodiment, the first distance D1 between the drain structures 108A and 108B and the gate electrode structure 106 is larger than the second distance D2.

As a result, the FinFET 2' combines the structure of the FinFET 1 illustrated in FIG. 1A and FIG. 1B and the FinFET 2 illustrated in FIG. 2A and FIG. 2B such that an even higher resistance between the drain structures 108A and 108B and the gate electrode structure 106 is obtained. The FinFET 2' can endure even larger voltage across the drain structures 108A and 108B and the gate electrode structure 106 and is more suitable under the high voltage operation condition.

Figure 3:
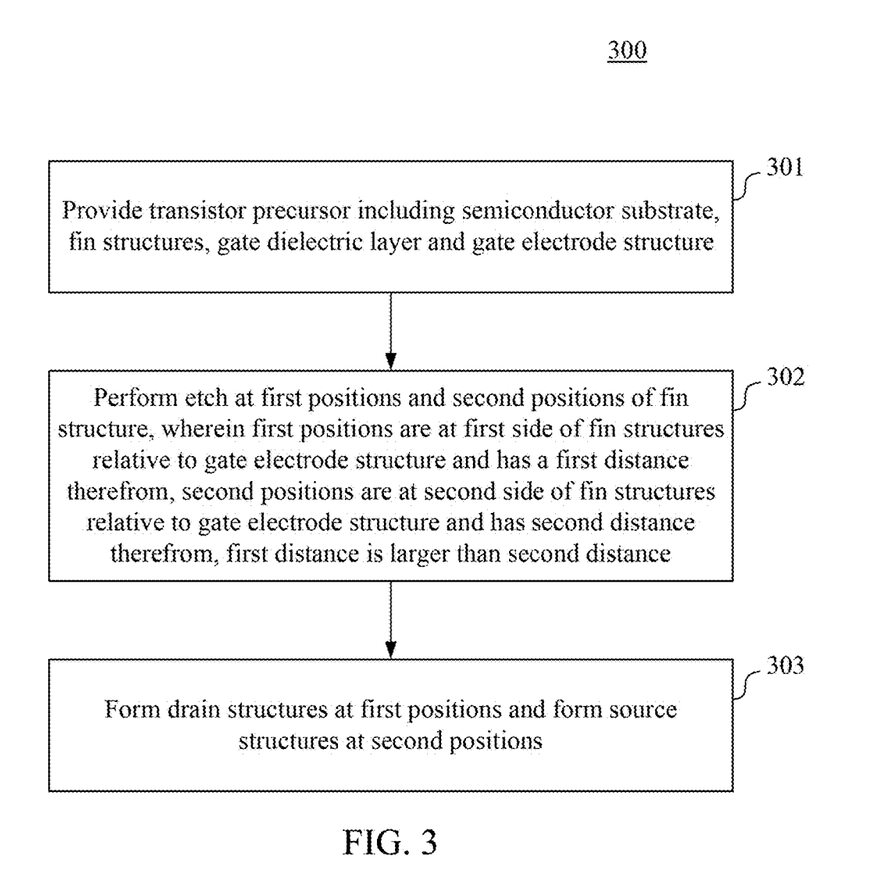
FIG. 3 is a flow chart of a FinFET manufacturing method in an embodiment of the present invention.
Figure 4A:
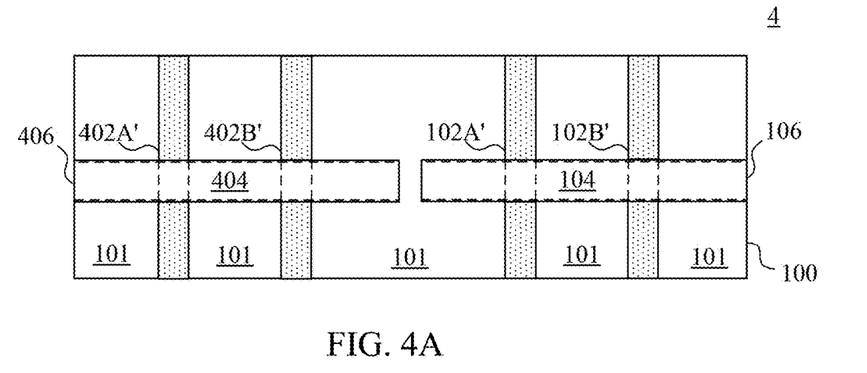
FIGS. 4A-4C are top views of the components in each steps of the FinFET manufacturing method in an embodiment of the present invention.
Figure 4B:
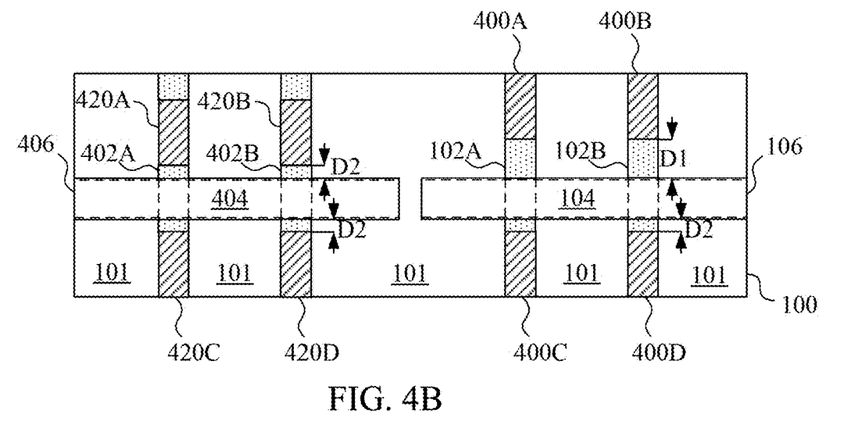
Figure 4C:
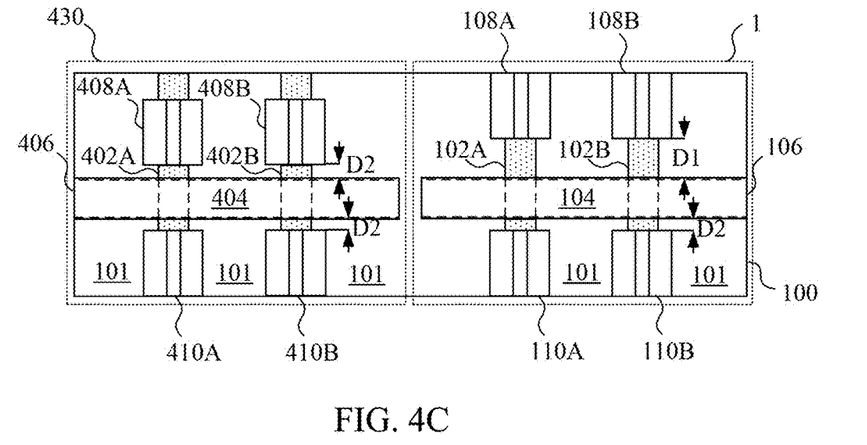

Reference is now made to FIG. 3 and FIGS. 4A-4C at the same time. FIG. 3 is a flow chart of a FinFET manufacturing method 300 in an embodiment of the present invention. FIGS. 4A-4C are top views of the components in each steps of the FinFET manufacturing method 300 in an embodiment of the present invention.

The FinFET manufacturing method 300 is used to manufacture such as, but not limited to the FinFET 1 illustrated in FIG. 1A and FIG. 1B. The FinFET manufacturing method 300 includes the steps outlined below. The steps are not recited in the sequence in which the steps are performed. That is, unless the sequence of the steps is expressly indicated, the sequence of the steps is interchangeable, and all or part of the steps may be simultaneously, partially simultaneously, or sequentially performed.

In step 301, a transistor precursor 4 illustrated in FIG. 4A is provided. The transistor precursor 4 includes the semiconductor substrate 100, the gate dielectric layer 104, the gate electrode structure 106, and the fin structures 102A' and 102B' that are not etched yet.

In step 302, as illustrated in FIG. 4B, etching is performed at first positions 400A and 400B and second positions 400C and 400D of the fin structure 102A' and 102B'.

The first positions 400A and 400B are at a first side of the fin structures 102A' and 102B' relative to the gate electrode structure 106 and has a first distance D1 from the gate electrode structure 106. The second positions 400C and 400D are at a second side of the fin structures 102A' and 102B' relative to the gate electrode structure 106 and has a second distance D2 from the gate electrode structure 106. The first distance D1 is larger than the second distance D2.

In an embodiment, the etching step is performed by such as, but not limited to defining the etching region on the transistor precursor 4 by hard mask (not illustrated) such that the etching process is performed thereafter.

In step 303, as illustrated in FIG. 4C, the drain structures 108A and 108B at the first positions are formed and the source structures 110A and 110B are formed at the second positions. In an embodiment, the drain structures 108A and 108B and the source structures 110A and 110B are formed by such as, but not limited to epitaxial growth.

As illustrated in FIG. 4C, the semiconductor device that includes the semiconductor substrate 100, the fin structures 102A and 102B, the gate dielectric layer 104, the gate electrode structure 106, the drain structures 108A and 108B and the source structures 110A and 110B is equivalent to the FinFET 1 illustrated in FIG. 1B.

It is appreciated that in an embodiment, as illustrated in FIGS. 4A-4C, the transistor precursor 4 provided in step 301 may further include the fin structures 402A' and 402B' that are not etched yet, the gate dielectric layer 404 and the gate electrode structure 406 on the semiconductor substrate 100. When the step 302 is performed, the positions 420A-420D that correspond to the first side and the second side of the gate electrode structure 406 and have equal distances therefrom can be etched simultaneously. In an embodiment, the distance between each of the etched positions and the gate electrode structure 406 is equivalent to the second distance D2.

Further, when the step 303 is performed, drain structures 408A and 408B and the source structures 410A and 410B can be simultaneously formed at the etched positions mentioned above. Accordingly, the semiconductor device that includes the semiconductor substrate 100, the etched fin structures 402A and 402B, the gate dielectric layer 404, the gate electrode structure 406, the drain structures 408A and 408B and the source structures 410A and 410B is equivalent to another FinFET 430.

Figure 5:
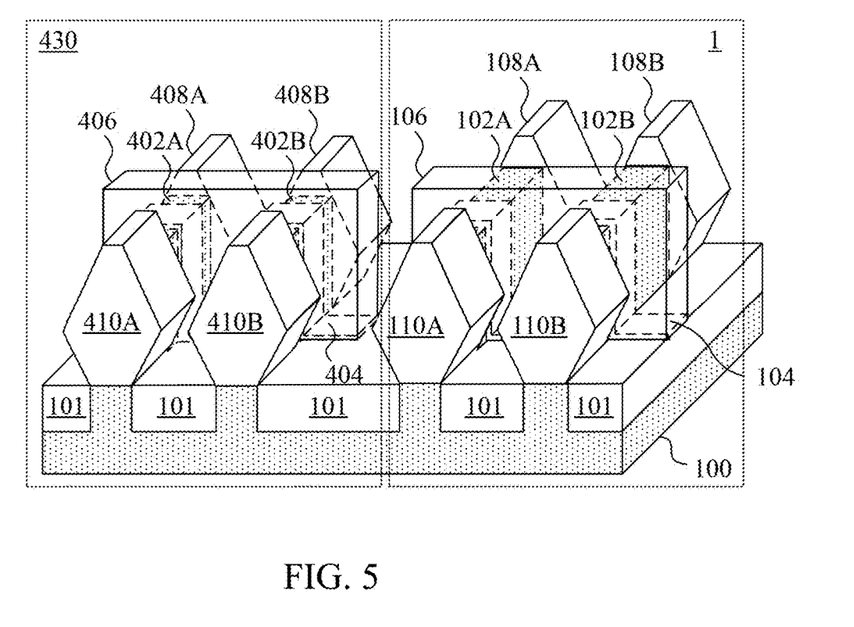
FIG. 5 is a three-dimensional (3-D) diagram of the FinFET and the FinFET illustrated in FIG. 4C in an embodiment of the present invention.

Reference is now made to FIG. 5. FIG. 5 is a three-dimensional (3-D) diagram of the FinFET 1 and the FinFET 430 illustrated in FIG. 4C in an embodiment of the present invention.

In practical condition, the FinFET 1 that includes the drain structures 108A and 108B and the source structures 110A and 110B having non-equal distances and the FinFET 400 that includes the drain structures 408A and 408B and the source structures 410A and 410B having equal distances can be formed by using a single manufacturing process. As a result, the FinFET 1 not only can be formed by using the same manufacturing method as the FinFET 430 without additional steps, but also can be formed simultaneously with the FinFET 430. The compatibility of the manufacturing method is ideal.

Figure 6:
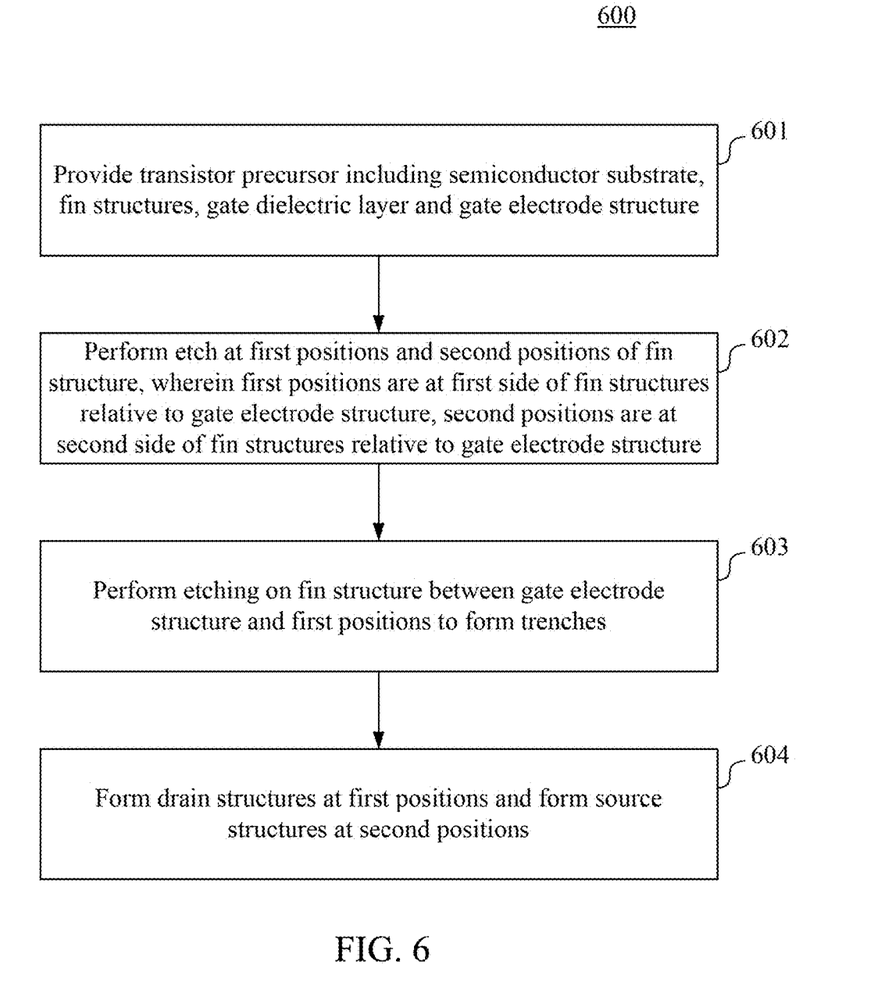
FIG. 6 is a flow chart of a FinFET manufacturing method in an embodiment of the present invention.
Figure 7A:
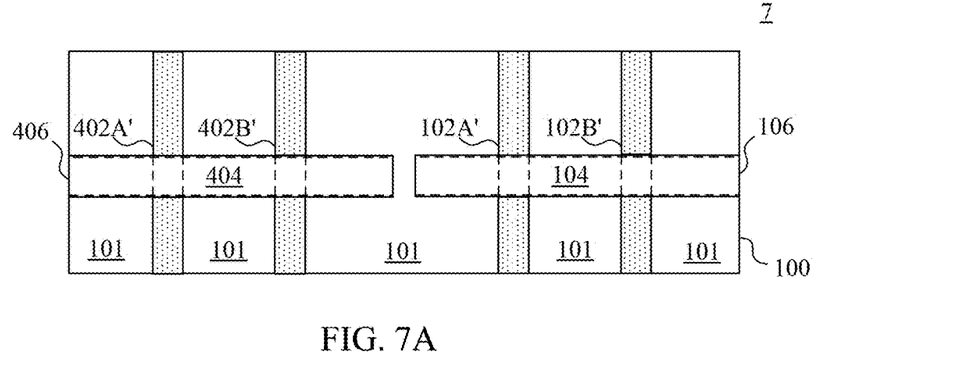
FIGS. 7A-7C are top views of the components in each steps of the FinFET manufacturing method in an embodiment of the present invention.
Figure 7B:
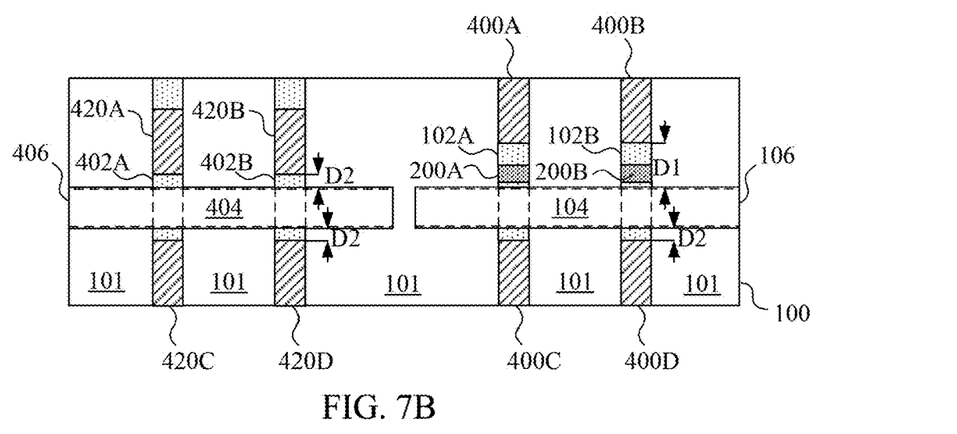
Figure 7C:
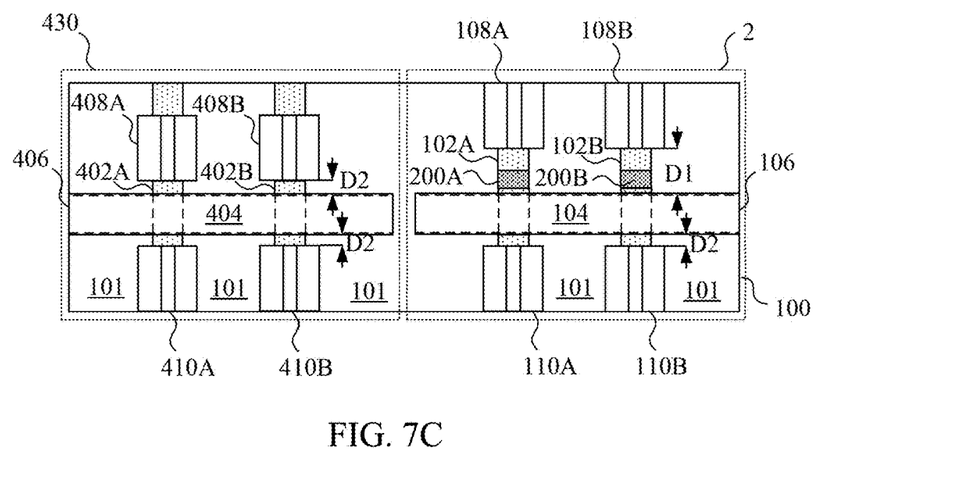

Reference is now made to FIG. 6 and FIGS. 7A-7C at the same time. FIG. 6 is a flow chart of a FinFET manufacturing method 600 in an embodiment of the present invention. FIGS. 7A-7C are top views of the components in each steps of the FinFET manufacturing method 600 in an embodiment of the present invention.

The FinFET manufacturing method 600 is used to manufacture such as, but not limited to the FinFET 2 illustrated in FIG. 2A and FIG. 2B. The FinFET manufacturing method 600 includes the steps outlined below. The steps are not recited in the sequence in which the steps are performed. That is, unless the sequence of the steps is expressly indicated, the sequence of the steps is interchangeable, and all or part of the steps may be simultaneously, partially simultaneously, or sequentially performed.

In step 601, a transistor precursor 7 illustrated in FIG. 7A is provided. The transistor precursor 7 includes the semiconductor substrate 100, the gate dielectric layer 104, the gate electrode structure 106, and the fin structures 102A' and 102B' that are not etched yet.

In step 602, as illustrated in FIG. 7B, etching is performed at first positions 400A and 400B and second positions 400C and 400D of the fin structure 102A' and 102B'.

In step 603, as illustrated in FIG. 7B, etching is performed on the fin structure 102A' and 102B' between the gate electrode structure 106 and the first positions 400A and 400B to form trenches 200A and 200B.

In an embodiment, the etching step mentioned above is performed by such as, but not limited to defining the etching region on the transistor precursor 7 by hard mask (not illustrated) such that the etching process is performed thereafter. Moreover, in an embodiment, when the depth of the trenches 200A and 200B equals to the height of the fin structures 102A and 102B relative to the semiconductor substrate 100, the etching in steps 602 and 603 can be performed simultaneously by using a single mask without additional steps.

In step 604, as illustrated in FIG. 7C, the drain structures 108A and 108B are formed at the first positions and the source structures 110A and 110B are formed at the second positions. In an embodiment, the drain structures 108A and 108B and the source structures 110A and 110B are formed by such as, but not limited to epitaxial growth.

As illustrated in FIG. 7C, when the first distance D1 of the first positions 400A and 400B relative to the gate electrode structure 106 and the second distance D2 of the second positions 400C and 400D relative to the gate electrode structure 106 are equal in step 602, the semiconductor device that includes the semiconductor substrate 100, the fin structures 102A and 102B, the gate dielectric layer 104, the gate electrode structure 106, the drain structures 108A and 108B, the source structures 110A and 110B and the trenches 200A and 200B is equivalent to the FinFET 2 illustrated in FIG. 2B.

When the first distance D1 is larger than the second distance D2 in step 602, the semiconductor device that includes the components mentioned above is equivalent to the FinFET 2' illustrated in FIG. 2D.

It is appreciated that in an embodiment, as illustrated in FIGS. 7A-7C, another FinFET 430 that includes the drain structures 408A and 408B and the source structures 410A and 410B having equal distances from the gate electrode structure 406 can also be formed in steps 601 to 603. As a result, the FinFET 2 not only can be formed by using the same manufacturing method as the FinFET 430 without additional steps, but also can be formed simultaneously with the FinFET 430. The compatibility of the manufacturing method is ideal.

The above embodiment is described by using the structure that the depth of the trenches 200A and 200B equals to the height of the fin structures 102A and 102B relative to the semiconductor substrate 100 as the example. In another embodiment, when the depth of the trenches 200A and 200B is smaller than the height of the fin structures 102A and 102B relative to the semiconductor substrate 100, additional masks are required to perform two stages of etching.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A FinFET manufacturing method comprising:
   providing a transistor precursor that comprises:
      a semiconductor substrate comprising a plurality of insulating areas;
      a fin structure disposed to extend on the semiconductor substrate between two of the insulating areas;
      a gate dielectric layer disposed to extend across two sides of the fin structure; and
      a gate electrode structure disposed on the gate dielectric layer;
   performing etching on a first position and a second position of the fin structure, wherein the first position is at a first side of the fin structure relative to the gate electrode structure and the second position is at a second side of the fin structure relative to the gate electrode structure; and
   forming a drain structure at the first position and forming a source structure at the second position;
   forming a trench between the gate electrode structure and the first position of the fin structure without contacting the gate structure and the drain structure, and the trench has a depth relative to a height of the fin structure, wherein the height of the fin structure is relative to the semiconductor substrate, and the depth of the trench is smaller than or equal to the height of the fin structure such that the drain structure has a first resistance relative to the gate electrode and the source structure has a second resistance relative to the gate electrode, and the first resistance is larger than the second resistance.

2. The FinFET manufacturing method of claim 1, further comprising:
   forming the drain structure such that the drain structure and the gate electrode structure have a first distance therebetween and forming the source structure such that the source structure and the gate electrode structure have a second distance therebetween, wherein the first distance is larger than the second distance.

3. The FinFET manufacturing method of claim 1, wherein the transistor precursor further comprises a plurality of fin structures, and the FinFET manufacturing method further comprises:
   performing etching on a first position and a second position of each of the plurality of fin structures, wherein the first position is at a first side of the gate electrode structure and the second position is at a second side of the gate electrode structure; and
   forming a plurality of drain structures each at the first position of each of the plurality of fin structures and forming a plurality of source structures each at the second position of each of the plurality of fin structures; and
   electrically coupling the plurality of drain structures and electrically coupling the plurality of source structures.

* * * * *